(12) United States Patent
Skofljanec et al.

(10) Patent No.: US 6,839,240 B2
(45) Date of Patent: Jan. 4, 2005

(54) HOUSING FOR AN ELECTRONIC CONTROL DEVICE IN MOTOR VEHICLES

(75) Inventors: Robert Skofljanec, Moos-Bankholzen (DE); Reinhard Lange, Gaienhofen (DE)

(73) Assignee: TRW Automotive Electronics & Components GmbH & Co. KG, Radolfzell (DE)

( * ) Notice: Subject to any disclaimer, the term of this patent is extended or adjusted under 35 U.S.C. 154(b) by 6 days.

(21) Appl. No.: 10/253,173

(22) Filed: Sep. 24, 2002

(65) Prior Publication Data

US 2003/0067751 A1 Apr. 10, 2003

(30) Foreign Application Priority Data

Sep. 24, 2001 (DE) ..................................... 201 15 670 U

(51) Int. Cl.⁷ ................................................. H05K 5/06
(52) U.S. Cl. ...................... 361/752; 361/800; 361/797; 361/682; 361/748
(58) Field of Search ................................. 361/752, 797, 361/800, 714, 724, 748, 825, 682, 796, 760, 736, 720

(56) References Cited

U.S. PATENT DOCUMENTS 4,837,664 A * 6/1989 Rodriguez et al. .......... 361/716
5,107,404 A * 4/1992 Tam .......................... 361/818

FOREIGN PATENT DOCUMENTS

| DE | 9110871 U1 | 12/1991 |
| DE | 9116755 U1 | 12/1993 |
| DE | 4439471 A1 | 5/1996 |
| DE | 19755399 A1 | 8/1998 |
| DE | 19719942 C2 | 12/1998 |

* cited by examiner

Primary Examiner—David Martin
Assistant Examiner—Hung Bui
(74) Attorney, Agent, or Firm—Tarolli, Sundheim, Covell & Tummino L.L.P.

(57) ABSTRACT

A housing for electronic control devices in motor vehicles comprises a generally parallelepipedal frame of plastics and a metallic envelope with spaced parallel top and bottom walls interconnected by parallel side walls and at least one open face. The top, bottom and side walls define a space and the frame is fitted into such space. The control device includes a printed circuit board and electronic components connected to the printed circuit board and engaged in shaped holding structures of the frame. The printed circuit board is located between the bottom wall and the frame. The printed circuit board is rigidly connected to the metallic envelope by metallic fasteners extending from the top wall through the frame and to the printed circuit board.

11 Claims, 8 Drawing Sheets

Fig. 5
Fig. 6
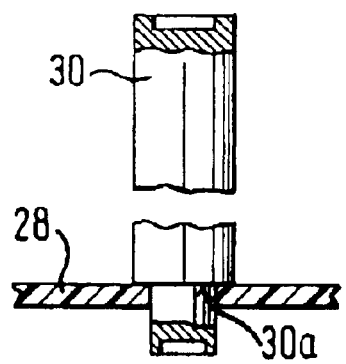
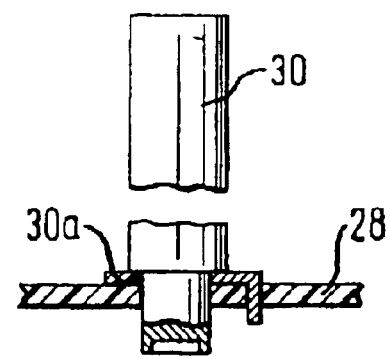

HOUSING FOR AN ELECTRONIC CONTROL DEVICE IN MOTOR VEHICLES

TECHNICAL FIELD

The present invention relates to a housing for an electronic control device in motor vehicles.

BACKGROUND OF THE INVENTION

Electronic control devices in vehicles are typically exposed to high thermal and mechanical stress. Consequently, they require a sufficiently resistant housing. Especially high demands are made of the housings of control devices that involve an acceleration sensor and that serve to actuate safety equipment in the vehicle, such as a belt tensioner or an air bag. With such control devices, it must be possible to rigidly connect the housing to the car body and to transmit the occurring accelerations to the acceleration sensor. Moreover, for the reliable functioning of the electronic components of the control device, there must be a good ground connection between the housing and the car body on the one hand, as well as between the housing and the electronic control device on the other hand.

These requirements are satisfied in conventional housings with heavy and bulky metallic structures.

BRIEF SUMMARY OF THE INVENTION

The present invention provides a housing for electronic control devices in vehicles that allows a simple and inexpensive mass production by optimally combining metallic frame parts with frame parts of plastics. According to the invention, a housing for electronic control devices in motor vehicles comprises a generally parallelepipedal frame of plastics and a metallic envelope with spaced parallel top and bottom walls interconnected by parallel side walls and at least one open face. The top, bottom and side walls define a space and the frame is fitted into such space. The control device includes a printed circuit board and electronic components connected to the printed circuit board and engaged in shaped holding structures of the frame. The printed circuit board is located between the bottom wall and the frame. The printed circuit board is rigidly connected to the metallic envelope by metallic fasteners extending from the top wall through the frame and to the printed circuit board. The frame can be molded from plastics with a great variety of holding and attachment structures adapted to the needs of each particular device since strength and rigidity are not primarily due to the mechanical properties of the frame. Rather, a rigid assembly is mainly due to the metallic fasteners that firmly connect the outer metallic envelope with the printed circuit board and, preferably, also clamp the frame between the top and bottom walls of the envelope.

In a first embodiment, the metallic fasteners are formed by elongate cylindrical studs the ends of which are attached to the top and bottom walls, respectively, of the outer metallic envelope. The cylindrical studs extend through the frame and are firmly connected, e.g. soldered, to the printed circuit board. The studs provide considerable strength to the housing, particularly against compression forces directed along their axes. Preferably the studs are also used to establish redundant electrical ground connections between the envelope and the printed circuit board.

In a second embodiment, the metallic fasteners are formed by fastening screws that extend through the top wall of the envelope and through the frame and that have their ends rigidly connected to the printed circuit board, preferably by engagement in screw nut members attached to the board. The frame is preferably clamped between the top wall of the envelope and the printed circuit board by tightening the fastening screws, thereby achieving a very rigid connection between the envelope and the printed circuit board. Preferably the screws are also used to establish redundant electrical ground connections between the envelope and the printed circuit board.

Additional advantages and characteristics of the invention will be apparent from the description below of several embodiments.

BRIEF DESCRIPTION OF THE DRAWINGS

FIG. 5 is a fractional view showing a stud in a condition of press-fit with the printed circuit board;

FIG. 6 is a fractional view showing a stud in a condition of a soldered connection with the printed circuit board;

DETAILED DESCRIPTION OF THE PREFERRED EMBODIMENTS

Figure 1:
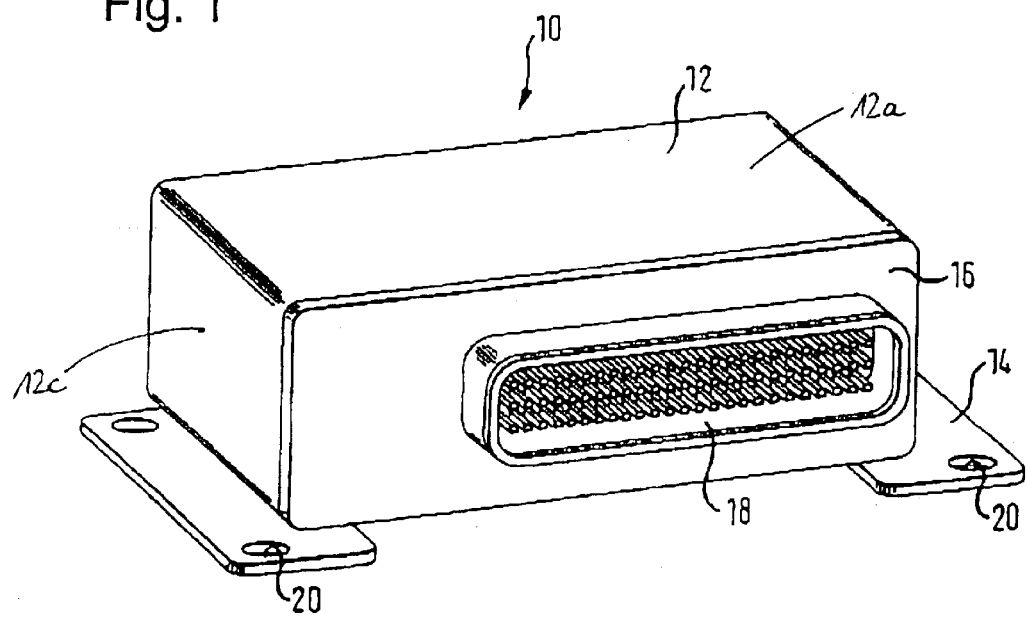
FIG. 1 is a perspective view of a first embodiment of the housing, looking towards a front plate provided with a plug socket.

The housing, which is generally designated at 10 in FIG. 1, has a metallic outer envelope 12, a base plate 14 on which the envelope 12 is attached, and a front plate 16, which carries a plug socket 18. The base plate 14 is provided with attachment openings 20 for anchoring the housing 10 on the car body. The housing further comprises a generally parallelepipedal frame 22 molded of plastics. Envelope 12 has a top wall 12a, a bottom wall 12b, side walls 12c, 12d interconnecting the top and bottom walls and an open front face. The frame 22 is fitted into the space defined by the walls of envelope 12 through the open face thereof.

Figure 2:
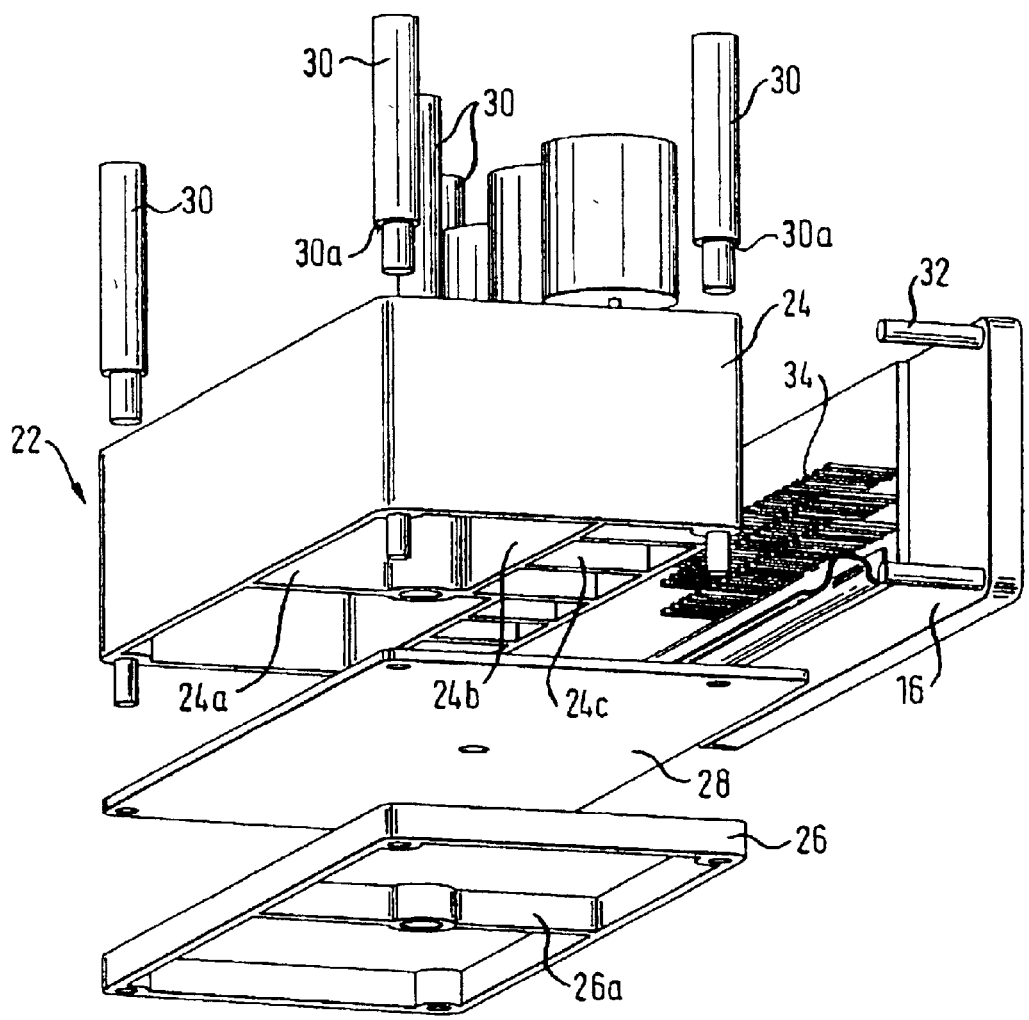
FIG. 2 is an exploded view of a frame molded of plastics with metallic studs, a printed circuit board and electronic components as well as a front plate.

The envelope 12 has an open front face through which a frame with the components shown in FIG. 2 is inserted. The frame, which is generally designated as 22, is parallelepipedal and consists of two frame parts 24, 26, between which a printed circuit board 28 is clamped. Both frame parts 24, 26 are made of plastic and can be manufactured, for example, by means of injection molding. The frame part 24 has a circumferential wall towards the outside and several partitions 24a, 24b, 24c that extend between the insides of the circumferential wall and that reinforce the frame part 24. Between these partitions 24a, 24b, 24c, there are receiving spaces for electronic components of an electronic control device that is installed on the printed circuit board 28.

The frame part 26 has an inner web 26a that connects two sides of the frame part with each other.

The frame 22, including the frame parts 24, 26 and the printed circuit board 28, is traversed by a number of metallic fasteners 30 which include one cylindrical elongate stud on each corner and one in the center of frame 22. These metallic studs 30 each have a step 30a for seating on a conductive face of the printed circuit board 28, as can be seen in FIGS. 3 through 6.

The front plate 16 that has the plug socket 18 is provided with pins 32 or the like for purposes of attachment to the frame 22. Contact pins 34 that project into the of the housing are connected to the printed circuit board 28.

Figure 3:
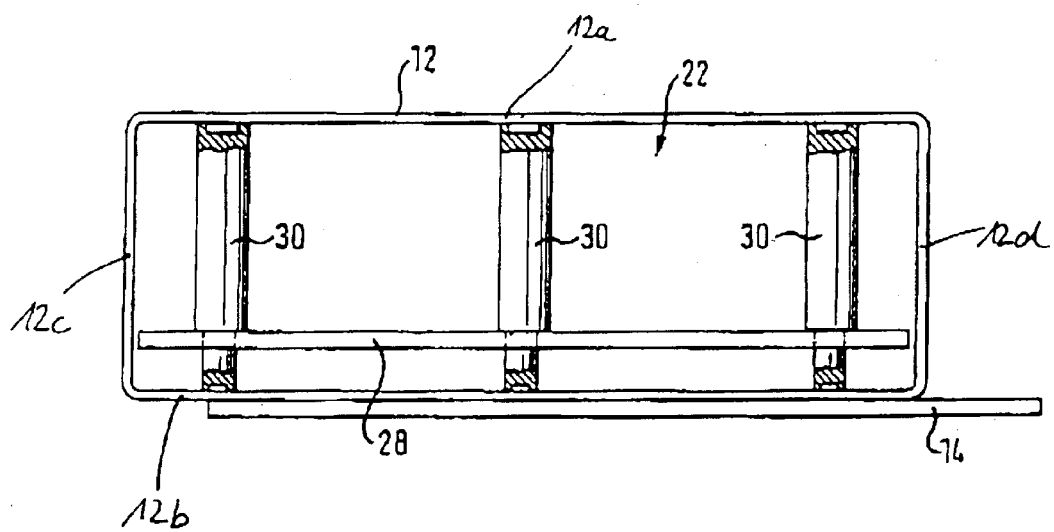
FIG. 3 is a cross section of the housing.
Figure 4:
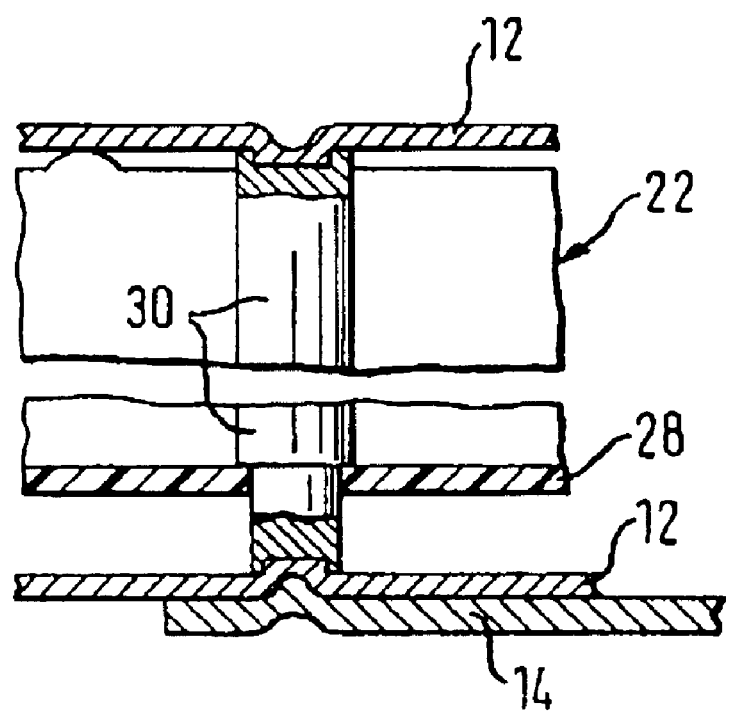
FIG. 4 is a sectional view of the housing through a metallic stud extending through the frame.

After the frame 22, with the studs 30 and the printed circuit board 28, has been inserted into the envelope, the axial ends of the studs 30 are in contact with the inner surface of the envelope 12 and extend between the top and bottom walls thereof, as shown in FIG. 3. As shown in FIG. 4, the axial end surfaces of the studs 30 each have a recess with an undercut, i.e. a recess that widens towards the inside. For purposes of establishing the mechanical and electrically conductive connection of the envelope 12 to the studs 30, the wall of the envelope is caulked into these undercut recesses of the studs 30, as shown in FIG. 4. The base plate 14 also undergoes a corresponding deformation in order to create a tight connection with the envelope 12.

In the embodiment shown in FIG. 5, the metallic studs 30 are pressed through corresponding openings in the printed circuit board 28 until the step 30a bears on its surface. With this technique, a mechanically sturdy and electrically conductive connection is created between the printed circuit board 28 and the studs 30.

As an alternative or in addition, as shown in FIG. 6, a soldered connection is created at the step 30a.

In the described embodiment, the envelope 12 is preferably made of aluminum by means of flow-molding. It is then cup-shaped and relatively thin-walled, so that it is inexpensive and easy to manufacture. Nevertheless, a mechanically very sturdy and extremely stiff structure is created by the frame with the metallic fasteners that extend through the frame, as a result of which the housing is well-suited for electronic control circuits in vehicles where an acceleration sensor is installed on the printed circuit board. Due to the stiff structure of the housing, accelerations transferred via the base plate 14 to the envelope 12 are then transferred unchanged to the printed circuit board 28 and to an acceleration sensor installed on its face. Furthermore, through the metallic fasteners, a redundant ground connection is created between the envelope and the printed circuit board.

Figure 7:
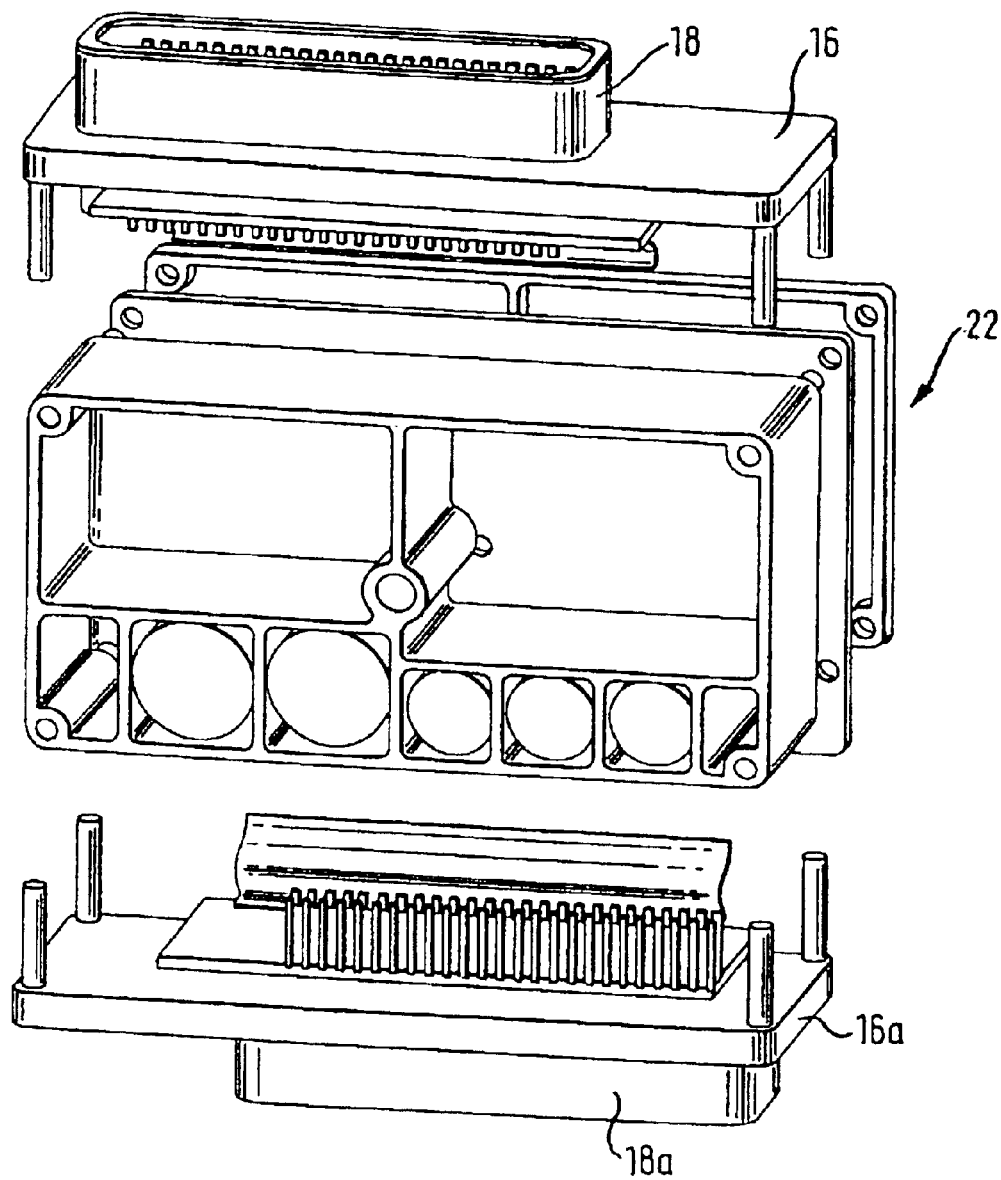
FIG. 7 is a perspective exploded view of a second embodiment of the housing with a plug socket on each of a front plate and an opposed back plate.
Figure 8:
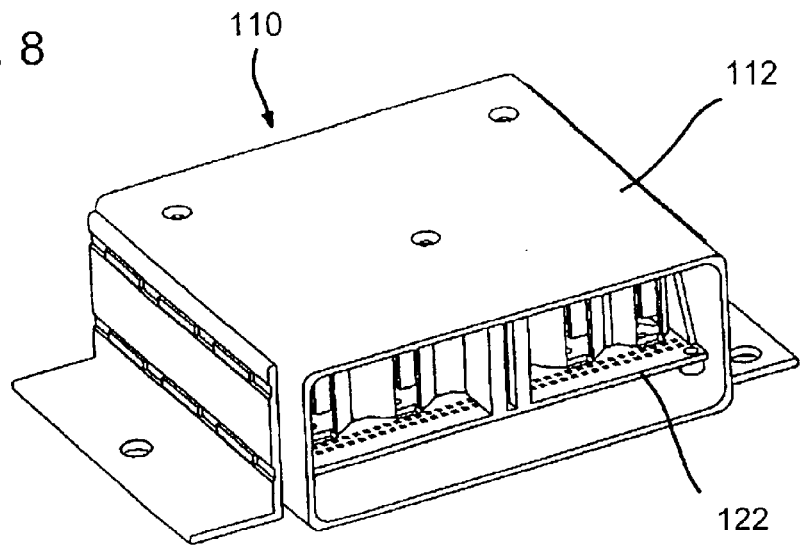
FIG. 8 is a perspective view of a second embodiment of the housing, looking towards the front where the front plate is removed.

In the housing embodiment shown in FIG. 7, there are two plug sockets 18, 18a that are arranged on two opposed plates 16, 16a, which close two opposed open sides of the envelope. The envelope (not shown in FIG. 7) generally has the shape of a tubular section with a rectangular cross section and it is preferably made by lengthening an extruded profile made of aluminum. The frame 22 in this embodiment can be formed analogously to the embodiment described above.

In another embodiment, not shown in the drawing, the frame is made in one piece. The printed circuit board is then put in place and attached onto the frame from below or slid laterally into a slit of the frame.

In the embodiment shown in FIGS. 8 to 11, the housing 110 likewise includes an outer metallic envelope 112 and a frame 122 molded of plastics and accommodated in envelope 112. Here, metallic fasteners that extend through frame 122 are formed by screws 130 (see FIG. 11). The top wall of envelope 112 has three holes arranged in a triangular fashion, each for passage of a screw 130. The free end of each screw 130 is threadedly engaged in a screw nut member 131 attached to printed circuit board 128 on its side facing the bottom wall of envelope 112.

Here, the fasteners are formed by the metallic screws 130, so that a redundant ground connection is likewise created between the envelope 112 and the printed circuit board 128.

Figure 10:
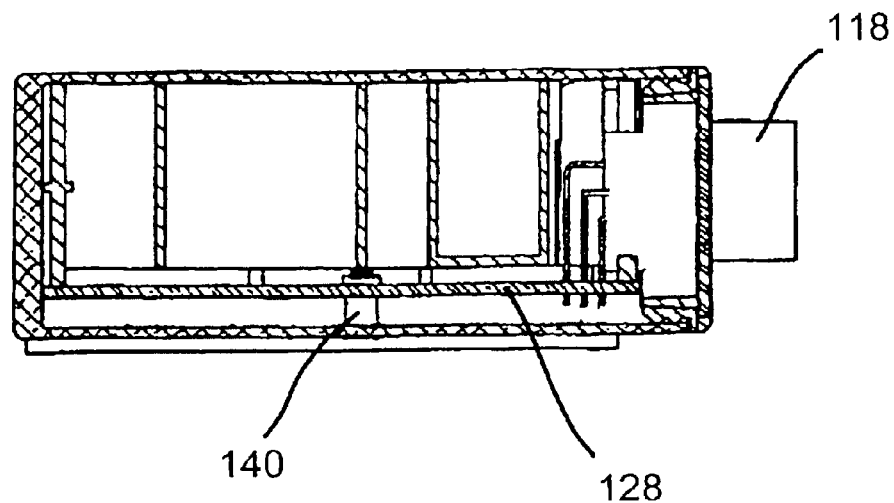
FIG. 10 is a first cross section of the housing.
Figure 11:
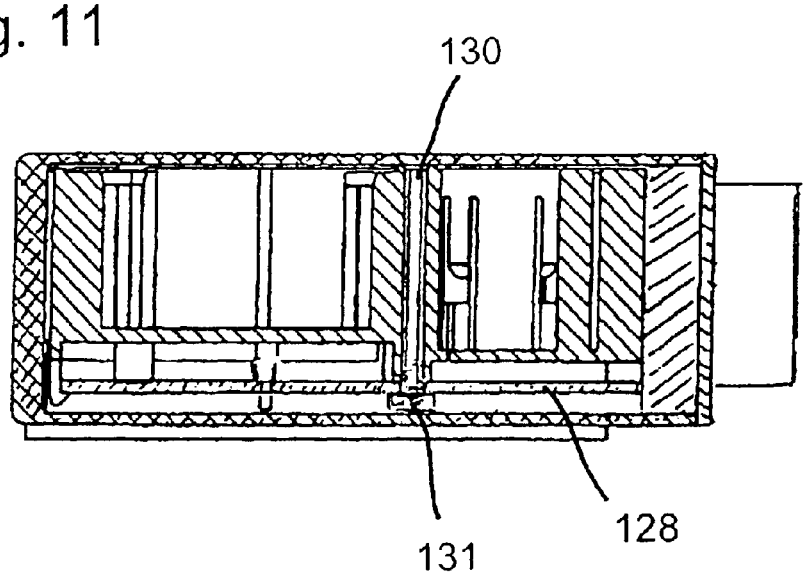
FIG. 11 is a second cross section of the housing.

The printed circuit board 128, as shown in FIG. 10, is rigidly connected to the bottom wall of the envelope by spacing fasteners 140. The spacing fasteners 140 are made of press-in sleeves with internal thread. They are mounted to printed circuit board 128 by means of a press-fit such that they are situated between the bottom wall and the printed circuit board. The bottom wall of envelope 112 has holes at each position of the spacing fasteners, each for passage of a further screw (not shown in FIG. 10). The free end of each further screw is threadedly engaged in the press-in sleeve from the bottom side.

Figure 9:
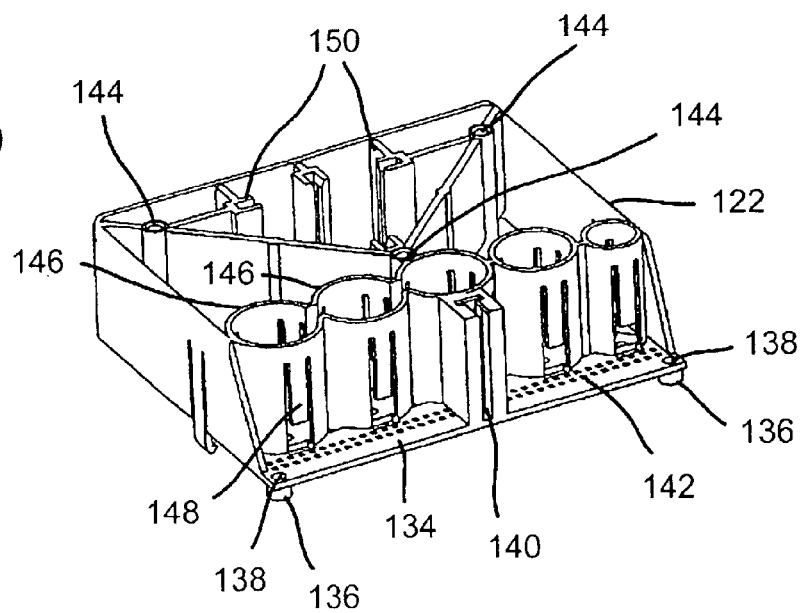
FIG. 9 is a perspective view of a frame molded of plastics.

As shown in FIG. 9, the frame has a base wall 134 which is parallel to and slightly spaced from the bottom wall of the envelope 112 by means of integrally molded spacers 136 on the frame 122, which are located between the bottom wall and the base plate 134.

As an alternative or in addition, as shown in FIG. 9, the frame 122 has an open front face. The plug-socket 118 (FIG. 10) is inserted into this open front face. In this arrangement, the plug socket 118 is directly connected to the frame 122. For this purpose the base plate 134 of the frame 122 comprises integrally molded connecting parts, which are provided for engaging corresponding connecting parts of the plug socket 118. The connecting parts on the frame 122 are formed by holes 138 and the plug socket comprises corresponding integrally molded pins engaging in the hole. A further connecting part can also be formed by an integrally molded guide slot 140, which is located on a wall being erected on the base plate 134. The plug socket comprises a integrally molded guide part such that it fits in the guide slot 140. In addition, the base plate 134 has a plurality of pin locator through holes 142 for receiving the pins of the plug socket 118.

The walls erected on the base plate 134 can also accommodate the metallic fasteners, which are formed by screws in this embodiment. For this purpose the walls of the frame comprise integrally molded sleeves 144, which are located at the same positions as the screws and create together with the screws a tight connection between the printed circuit board 128 and the envelope 112.

The printed circuit board 128 may comprise electronic components which are received in integrally molded holding structures 146. The holding structures 146 are formed by walls on base plate 134 of the frame 122 and define an accommodation space for the components.

The holding structures 146 may be provided with integrally molded, resiliently deflectable lugs 148. There lugs are used to provide compensation for different dimensional tolerances of the components. The holding structures 146 accommodate bulky components such as capacitors, which are mounted to the printed circuit board 128 such, that a space underneath the bulky components can be used for other components as well. With that way of mounting, the connections between bulky components and the printed circuit board are substantially free from shear stress due to forces possibly applied to the housing 110.

The walls erected on the base plate comprise integrally molded guide slots 150 for insertion of at least one printed circuit sub-board. The sub-board can be used to accommodate further components for other sensor circuits, for example.

What is claimed is:

1. Apparatus comprising an electronic control device for a motor vehicle, and a housing for said electronic control device, said housing comprising a generally parallelepipedal frame of plastics and a metallic envelope with spaced parallel top and bottom walls, parallel side walls interconnecting said parallel top and bottom walls and at least one open face, said top, bottom and side walls defining a space and said frame being fitted into said space, said control device comprising at least one printed circuit board and electronic components connected to said printed circuit board and engaged in shaped holding structures of said frame, said printed circuit board being located between said bottom wall and at least a part of said frame, and said printed circuit board being rigidly connected to said metallic envelope by metallic fasteners extending from said top wall through said frame and to said printed circuit board.

2. The apparatus according to claim 1, wherein said metallic fasteners comprise elongate cylindrical studs each having a first end rigidly connected to said top wall and a second end connected to said printed circuit board.

3. The apparatus of claim 2, wherein said second stud ends extend across said printed circuit board and are rigidly connected to said bottom wall.

4. The housing according to claim 2, wherein said studs have internally widening recesses at said first ends and said top wall is caulked to engage into said recesses.

5. The apparatus according to claim 1, wherein said metallic fasteners establish an electrical ground connection between said envelope and said printed circuit board.

6. The apparatus according to claim 1, wherein said open face is closed by a front plate carrying a plug socket.

7. The apparatus according to claim 1, wherein said envelope is made of aluminum by means of flow-molding.

8. Apparatus comprising an electronic control device for a motor vehicle, and a housing for said electronic control device, said apparatus comprising a generally parallelepipedal frame of plastics and a metallic envelope with spaced parallel top and bottom walls, parallel side walls interconnecting said parallel top and bottom walls and at least one open face, said top, bottom and side walls defining a space and said frame being fitted into said space, said control device comprising at least one printed circuit board and electronic components connected to said printed circuit board and engaged in shaped holding structures of said frame, said printed circuit board being located between said bottom wall and at least part of said frame, and said printed circuit board being rigidly connected to said metallic envelope by metallic fasteners, said metallic fasteners comprising studs, each of said studs extending from said top wall through said frame and to said bottom wall of said envelope.

9. The apparatus according to claim 8, wherein said metallic fasteners each have a step which bears on said printed circuit board.

10. The apparatus according to claim 8, wherein said envelope has an inner surface and an outer surface and the axial ends of said metallic fasteners are in contact with the inner surface of said envelope after said frame has been fitted into said space defined by said envelope.

11. Apparatus comprising an electronic control device for a motor vehicle, and a housing for said device, said housing comprising a generally parallelepipedal frame of plastics and a metallic envelope with spaced parallel top and bottom walls interconnected by parallel side walls and at least one open face, said top, bottom and side walls defining a space and said frame being fitted into such space, said control device comprising at least one printed circuit board and electronic components connected to said printed circuit board and engaged in shaped holding structures of said frame, said printed circuit board being located between said bottom wall and at least part of said frame, and said printed circuit board being rigidly connected to said metallic envelope by metallic fasteners extending from said top wall through said frame and to said printed circuit board, said metallic fasteners comprising elongate cylindrical studs each having a first end rigidly connected to said top wall end a second end connected to said printed circuit board, said second stud ends extending across said printed circuit board and being rigidly connected to said bottom wall, said studs have internally widening recesses at said second ends end said bottom wall being caulked to engage into said recesses.

* * * * *

UNITED STATES PATENT AND TRADEMARK OFFICE
CERTIFICATE OF CORRECTION

PATENT NO. : 6,839,240 B2
DATED : January 4, 2005
INVENTOR(S) : Robert Skofljanec and Reinhard Lange It is certified that error appears in the above-identified patent and that said Letters Patent is hereby corrected as shown below:

Column 6,
Line 39, after "ends" change "end" to -- and --.

Signed and Sealed this

Seventh Day of June, 2005

JON W. DUDAS
*Director of the United States Patent and Trademark Office*